United States Patent
Katayama et al.

(10) Patent No.: US 6,939,188 B2
(45) Date of Patent: Sep. 6, 2005

(54) LED LAMP CONFIGURED TO MINIMIZE IMAGE CONTRAST

(75) Inventors: Hiroyuki Katayama, Yamatokoriyama (JP); Kazuhisa Murata, Tenri (JP); Masaaki Katoh, Osaka (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

(21) Appl. No.: 10/208,382

(22) Filed: Jul. 29, 2002

(65) Prior Publication Data

US 2003/0025450 A1 Feb. 6, 2003

(30) Foreign Application Priority Data

Aug. 1, 2001 (JP) ...................................... 2001-233287

(51) Int. Cl.⁷ ................................................ H01J 9/38
(52) U.S. Cl. .............................. 445/13; 445/14; 445/24; 445/58; 438/25
(58) Field of Search ............................... 445/58, 14, 13, 445/24; 257/680, 98, 99, 100; 438/22, 25, 26; 362/800; 313/512, 483, 502, 503, 113

(56) References Cited

U.S. PATENT DOCUMENTS

| | | | | |
|---|---|---|---|---|
| 4,224,116 A | * | 9/1980 | Knibb et al. ............... 205/122 |
| 5,011,744 A | * | 4/1991 | Saito et al. ................. 428/623 |
| 5,289,082 A | * | 2/1994 | Komoto ...................... 313/500 |
| 5,382,811 A | * | 1/1995 | Takahashi ................... 257/88 |
| 5,656,829 A | * | 8/1997 | Sakaguchi et al. .......... 257/94 |
| 5,986,401 A | * | 11/1999 | Thompson et al. ......... 313/504 |
| 6,057,067 A | * | 5/2000 | Isberg et al. ................. 430/7 |
| 6,340,824 B1 | * | 1/2002 | Komoto et al. ............. 257/99 |
| 6,377,292 B1 | * | 4/2002 | Shimizu et al. ............. 347/238 |
| 6,393,092 B1 | * | 5/2002 | Yoshida ...................... 378/19 |
| 6,498,592 B1 | * | 12/2002 | Matthies ..................... 345/1.1 |
| 6,633,120 B2 | * | 10/2003 | Salam ......................... 313/499 |

FOREIGN PATENT DOCUMENTS

| | | |
|---|---|---|
| JP | 05027688 A | 2/1993 |
| JP | 07288343 A | 10/1995 |
| JP | 2000299502 A | 10/2000 |
| JP | 2001068739 A | 3/2001 |
| JP | 2001345484 A | 12/2001 |

* cited by examiner

Primary Examiner—Edward J. Glick
Assistant Examiner—Elizabeth Keaney
(74) Attorney, Agent, or Firm—Morrison & Foerster LLP

(57) ABSTRACT

An LED lamps capable of composing a display panel that is installed at any outdoor place and capable of displaying an image thereon with a high contrast under any working conditions at any place. The LED lamp comprises at least one LED chip for emitting visible light, a lead frame comprising a common part and separate parts for supplying electric power to each of electrode terminals of the LED chip and a transparent resin part disposed on the common lead frame for mounting the LED chip and converging light emitted from the LED chip, wherein the LED-chip-mounted surface is provided with an anti-reflection black-colored layer for absorbing light. The LED chip may be a four-element LED chip composed of an active layer of AlGaInP and the light-absorbing layer formed from any of black silver sulfide, silver oxide, iron oxide, chromium oxide, black silver paste and black copper paste.

2 Claims, 6 Drawing Sheets

FIG.2
(PRIOR ART)
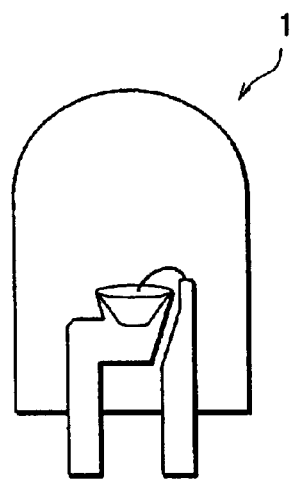
FIG.3A
(PRIOR ART)
FIG.3B
(PRIOR ART)
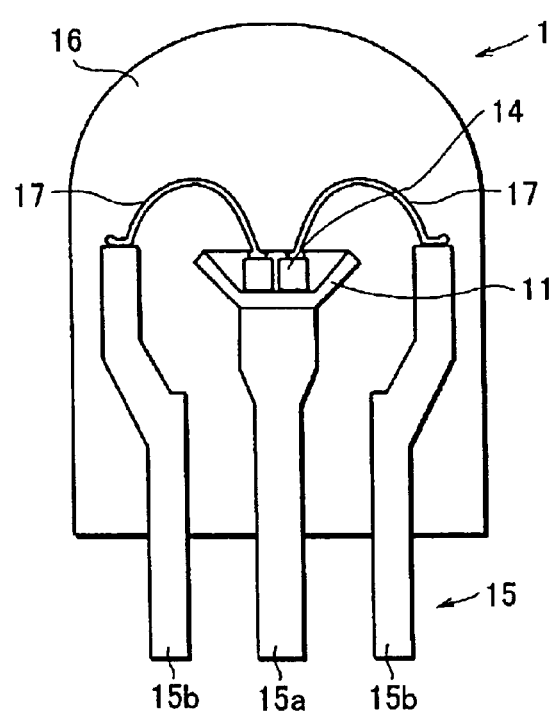
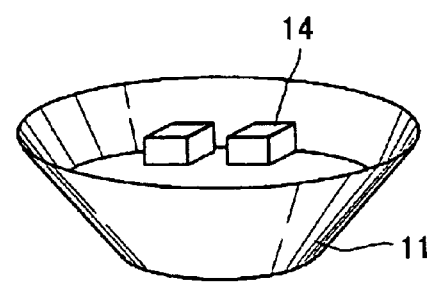

LED LAMP CONFIGURED TO MINIMIZE IMAGE CONTRAST

BACKGROUND OF THE INVENTION

The present invention relates to an LED lamp using light-emitting diodes and a method of manufacturing the same lamps. More specifically, this invention relates to LED lamps to be arranged in a matrix forming an outdoor display panel and a method of manufacturing the LED lamps for the same purpose. The outdoor display panel, which is formed by a matrix of the LED lamps according to the present invention, is controlled by a driving IC in such a manner that LED lamps located at designated positions in the matrix are switched on to emit single or multi-color light to display characters, figures and/or an image. It is usable for a lamp display panel such as for example a road signboard, an outdoor signboard or an advertising signboard.

An LED display panel for displaying characters, figures or images is usually constructed by a matrix of equally spaced LED lamps capable of emitting single or multi-color light. Characters, figures or images are displayed on the display panel by selectively driving LED lamps arranged thereon in accordance with the selected lamp positions and colors.

However, any display panel installed outdoor may suffer the affection of the sunlight that enters the LED lamps and, after reflection and refraction, emerges again from the lamps together with light emitted from the switched-on lamps. As the result of this, light synthesized of light emitted from the switched-on LED lamps and reflected sunlight from the LED lamps affects eyes of each observer. Accordingly, it is needed to provide means for facilitating recognition of characters displayed on the outdoor display panel with due consideration of the locations of the sun and the installation conditions of the panel.

To solve the above problem concerning the locations of sun and installation conditions of the display panel, there has been proposed such a conventional display panel wherein spaces formed between LED lamps arranged in a matrix in the display panel are covered with black resin layers and spaces between respective rows of the lamps arranged in the horizontal direction are partially covered with louvers to reduce the quantity of the sunlight that may fall on the lamps.

Referring to FIGS. 1A, 1B and 1C, there is shown a typical construction of a conventional display panel 100. FIG. 1A is a schematic perspective illustration of the conventional display panel 100 viewed from the side direction and FIG. 1B is a schematic perspective illustration of the same panel viewed from the upper right direction. FIG. 1C is a schematic sectional view of the same display panel 100.

FIG. 2 is a schematic sectional view of an LED lamp usable for the conventional display panel shown in FIGS. 1A, 1B and 1C. A number of the LED lamps are arranged at approximately equal intervals in a matrix forming a display panel.

As shown in FIGS. 1A and 1B, the display panel 100 with LED lamps (i.e., LED display unit) incorporates a matrix of LED lamps 1 approximately equally spaced from each other. The spaces between the LED lamps are covered with black resin films 3 formed thereon to absorb sunlight for reducing reflected sunlight. This also produces the enhanced contrast between the light emitting from switched-on LED lamps and the reflected sunlight.

As shown in FIG. 1C, there are arranged louvers 2 one per space between two rows of LED lamps 1 in the matrix to restrict an incident angle of the sunlight directed to the LED lamps 1. This may also increase the contrast between the light emitted from LED chips in the LED lamps 1 and the reflected sunlight from the LED lamps.

Generally, the sunlight incident to each of the LED lamps 1 includes direct rays and rays scattered and refracted by particles such as dust, water drops and gas particles while it traveled through the atmosphere from the sun. It is recognized that the direct incident light of the sun is more intensively reflected from the LED lamp 1.

In early morning or evening when the sun locates low in the sky and the sunlight travels a longer distance through the atmosphere to the display panel, the sunlight that is visible light having long wavelengths and is not easily subjected to diffusion and refraction by particles such as dust, water and gas may directly enter the LED lamps 1 of the display panel without being shut off by the louvers 2. As the result of this, the ratio of intensity of the reflected sunlight increases, resulting in decreasing the contrast between the light emitted from the switched-on LED lamps and the sunlight reflected from the inside of the switched-off LED lamps.

To improve the contrast, louvers may be elongated to decrease an incident angle of the sunlight to the display panel and thereby shorten the duration of decreasing the contrast of an image displayed on the display panel.

Referring now to FIGS. 3A and 3B, the conventional LED lamp 1 (FIG. 2) with a lead frame for supply electric power to terminals of LED chips in the lamp will be described below in detail. FIG. 3A is a schematic sectional view of the conventional LED lamp using a lead frame and FIG. 3B is a schematic perspective view of a light-reflecting cup 11 used in the LED lamp 1 of FIG. 3A.

As shown in FIG. 3A, the LED lamp 1 uses extending lead frames 15 serving as terminals for supplying electric power to LED chips 14 incorporated in a transparent resin-made package 16 having a cannonball shape suitable for collecting radiant light rays.

In FIGS. 3A and 3B, there is shown the LED lamp 1 of the type that it emits multi-colored light from two LED chips 14 for different colors disposed in the light reflecting cup 11 mounted on the top of a common lead frame 15a forming a common electric connection circuit for the LED chips.

Each LED chip 14 is connected at one electrode terminal (anode or cathode) to one of separate lead frames 15b (for different colors) with a lead wire 17 bonded thereto and connected at the other electrode terminal (cathode or anode) to the common lead frame 15a by using conducting adhesive. The common frame 15a forms for example a ground terminal.

As described above, the light reflecting cup 11 mounted on the top of the common lead frame 15a is intended to effectively collect the light emitted from the LED chips 14 disposed therein in the direction of light path. For this purpose, as shown in FIG. 3B, its side wall surrounding the LED chips 14 is slanted in the light path direction at an angle suitable to collect the light emitted from the LED chips with no interference with the light emitted from the neighboring LED lamps 1. The height of the slanted side wall of the light reflecting cup 11 is also adjusted to ensure a necessary angle of visibility.

As described above, the display panel 100 according to the prior art is provided with louvers 2 and black surface layers 3 on the panel 100 as shown in FIGS. 1A to 1C to reduce the amount of the sunlight reflected from the inside of each LED lamp. In daytime while the sun locates high in the sky, the contrast between the light emitted from the LED chips 14 and the reflected sunlight may be well adjusted. However, in the early morning or evening when the sun locates low in the sky, the sunlight may enters the LED lamps at an incident angle of 15 degrees or less without being shut off by the louvers 2 because the louvers cannot be further adjusted in relation to the angle of visibility. The sunlight having entered the LED lamps 1 on the display panel repeats reflection and refraction and then goes out of the lamps 1 as considerably intensive reflected light together with the light emitted from the LED chips 14 of the switched-on LED lamps.

As a result of this, the relative intensity of the light emitted from the LED chips 14 of switched-on LED lamps 1 to the reflected sunlight from switched-off LED lamps 1 on the display panel 100 decreases. Furthermore, the relative intensity of the light emitted from the LED chips 14 of the switched-on LED lamps 1 to the light not absorbed and reflected from the black surface portions 3 also decreases.

Consequently, the contrast between the light emitted from the LED chips 14 of the switched-on LED lamps 1 and the reflected sunlight from non-light-emitting portions including the switched-off LED lamps 1 on the display panel 100 decreases, making it difficult for observers to see any character, figure or image displayed on the display panel 100 in a specified duration of time under a specified site condition.

In other words, the conventional display panel using LED lamps encountered various problems in its applications regarding a considerable decrease in contrast between the light emitted from the LED chips of the switched-on LED lamps and the sunlight reflected from non-light-emitting portions including the switched-off LED lamps on the display panel. For example, a considerable decrease in contrast of an image may occur on the display panels installed along a street and a slight curved portion of a highway, which may be resulted from, for example, locations of the panel, the observer and the sun and/or the installation angle of the panel. Furthermore, the same contrast problem may occur on the display panels installed on a bay-bridge highway or snowfield road where reflected sunlight is particularly intensive.

SUMMARY OF THE INVENTION

An object of the present invention is to provide an LED lamp and a method of manufacturing the same LED lamp capable of preventing decreasing of the image contrast irrespective of installing location and conditions of a display panel with the LED lamps.

Another object of the present invention is to provide an LED lamp that comprises LED chips emitting visible light, a lead frame, which is for supplying electric power to LED chips, composed of a common part connected to electrode terminals of the LED chips and separate parts connected to electrode terminals of corresponding LED chips and a transparent resin portion for collecting light emitted from the LED chips, wherein a surface on which the LED chips mounted is covered with a black-colored light-absorbing layer.

Another object of the present invention is to provide an LED lamp comprising 4-element LED chips whose active layer is made of AlGaInP.

Still another object of the present invention is to provide an LED lamp wherein the surface on which the LED chips are mounted is plain board.

A further object of the present invention is to provide an LED lamp wherein the LED chip mounting surface has a side wall outwardly slanting in the light path direction for surrounding the LED chips.

Another object of the present invention is to provide an LED lamp wherein the LED chip mounting surface is provided with a light absorbing layer made of black silver sulfide.

Another object of the present invention is to provide an LED lamp wherein the LED chip mounting surface is provided with a light absorbing layer made of black silver oxide.

Another object of the present invention is to provide an LED lamp wherein the LED chip mounting surface is provided with a light absorbing layer made of black iron oxide.

Another object of the present invention is to provide an LED lamp wherein the LED chip mounting surface is provided with a light absorbing layer made of black chromium oxide.

A further object of the present invention is to provide an LED lamp wherein the LED chip mounting surface is provided with a light absorbing layer made of black silver paste.

A still further object of the present invention is to provide an LED lamp wherein the LED chip mounting surface is provided with a light absorbing layer made of black copper paste.

Another object of the present invention is to provide an LED lamp wherein the LED chip mounting surface is provided with a light absorbing layer made mainly of nickel.

A further object of the present invention is to provide an LED lamp wherein the LED chip mounting surface is provided with a light absorbing layer made mainly of chromium.

A further object of the present invention is to provide an LED lamp wherein the LED chip mounting surface is provided with a light absorbing layer made mainly of zinc.

A still further object of the present invention is to provide an LED lamp wherein the LED chip mounting surface is provided with a light absorbing layer made mainly of black resin.

Another object of the present invention is to provide a method of manufacturing an LED lamp, whereby a light-absorbing layer made of black silver sulfide is formed in such a manner that an electrode terminal of each LED chip is connected to a common part and a separate part of a silver-coated lead frame by die bonding with silver paste and wire bonding and then the silver plated surface is sulfurized with hydrogen sulfide solution or gas.

A further object of the present invention is to provide a method of manufacturing an LED lamp, whereby a light-absorbing layer made of black silver sulfide is formed in such a manner that an electrode terminal of each LED chip is connected to a common part and a separate part of a silver-plated lead frame by die bonding with silver paste and wire bonding and then the silver coat is oxidized by immersing in nitric acid solution or by irradiating with UV (ultraviolet rays) in an atmosphere of oxygen gas.

BRIEF DESCRIPTION OF THE DRAWINGS

FIG. 2 is a schematic sectional view of an LED lamp usable in the display panel shown in FIGS. 1A to 1C.

FIG. 3A is a schematic sectional view of a conventional LED lamp using a lead frame and FIG. 3B is a perspective view of a light-reflecting cup of the LED lamp of FIG. 3A.

PREFERRED EMBODIMENT OF THE INVENTION

Referring to accompanying drawings, an LED lamp and a method of manufacturing the same lamp according to preferred embodiments of the present invention will be described below.

Figure 1A:
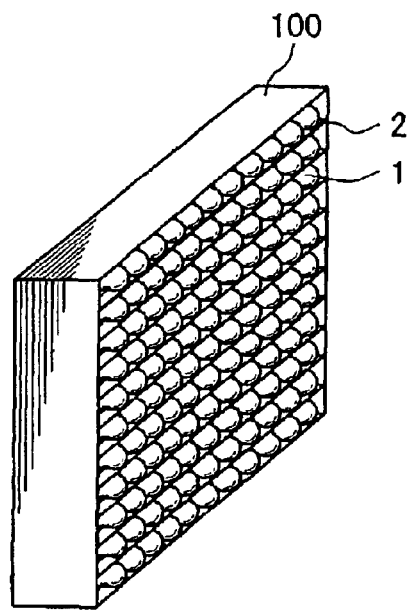
FIGS. 1A, 1B and 1C are illustrative of construction of a conventional display panel using light-emitting diode lamps.
Figure 1B:
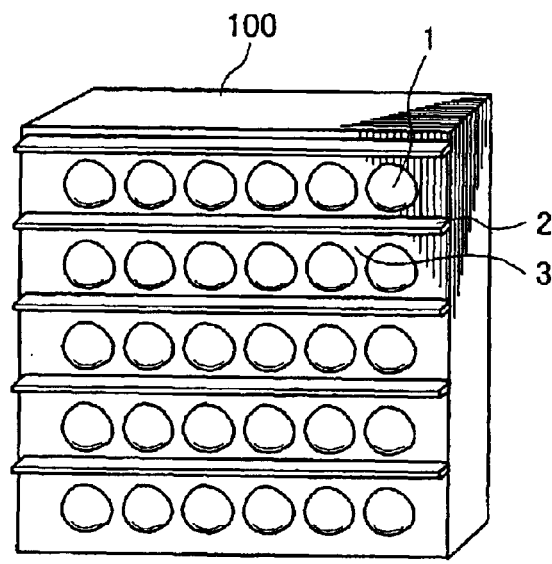
Figure 1C:
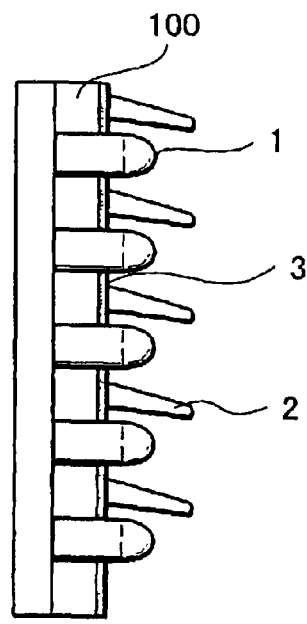
Figure 4:
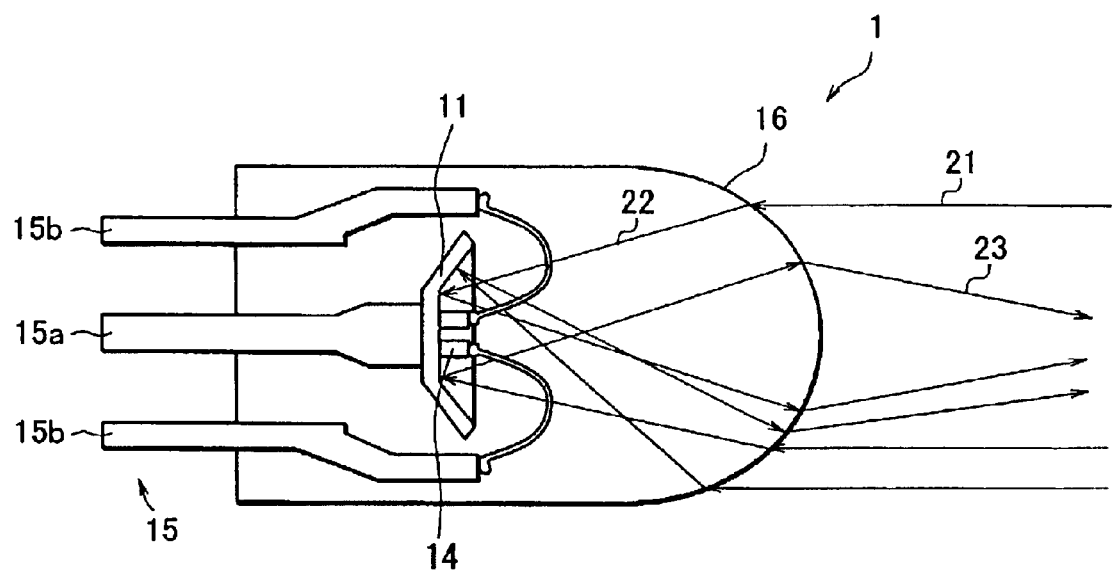
FIG. 4 is a schematic illustration of paths of considerably affecting rays of the sunlight entered the LED lamp and reflected from the same lamp.

Prior to explaining the construction of an LED lamp according to the present invention, the result of examination of a conventional display panel for factors lowering the contrast of an image thereon is described with reference to FIG. 4 showing optical paths of considerably affecting rays of sunlight reflected from one of LED lamps composing the display panel installed outdoor.

As shown in FIG. 4, the sunlight 21 entered the LED lamp was reflected from the surface of a light-reflecting cup 11 mounted on the top of a common lead frame 15a and the LED chips 14 disposed therein, and the reflected light traveled back and emerged again from the LED lamp 1. The test result indicates that the luminous intensity of the reflected sunlight 23 has the most effect on reducing the image contrast.

Namely, the result of the full examination made for estimating factors decreasing the contrast between the light emitted from the LED chips 14 of the switched-on LED lamps 1 and the reflected sunlight from the switched-off LED lamps 1 on the display panel indicates that among visible light entered the switched-off LED lamps 1, subjected to reflection and refraction therein and outputted therefrom, the incident rays 22 directly entered to the surface of the light-reflecting cup 11 was outputted from the lamp as reflected rays 23 with the greatest intensity.

More specifically, the reflected rays of the sunlight 21 incident to each of the LED lamps 1 were classified into three kinds of reflected rays of the sunlight: rays reflected from the transparent-resin made surface 16 of the LED lamp 1; rays that entered the LED lamp 1 and were totally reflected from transparent resin molecules existing therein, subjected to repeated reflection and refraction and then outputted therefrom; and rays that were inputted into the lamp, directly reflected from the surface of the light-reflecting cup 11 mounted the top of the common lead frame 15a and the LED chips 14 disposed therein, and outputted from the lamp. The intensities of the three kinds of reflected rays having the effect on the reflection light intensity of the display panel were determined respectively. The result of the measurements indicates that the rays 22 of the incident sunlight 21 entered the LED lamp and directly reflected from the surface of the light-reflecting cup 11 can be outputted as the most intensive reflected light 23.

On the condition that the sunlight 21 could enter the display panel using the above-described LED lamps 1 (i.e., LED display unit) at an elevation angle of 10 degrees, the reflection intensity of the sunlight was measured on the display panel. The result of measurements shows that the intensity of the reflected light 23 from the light-reflecting cups 11 in the LED lamps corresponds to about 70% of the total reflection light intensity.

Figure 5:
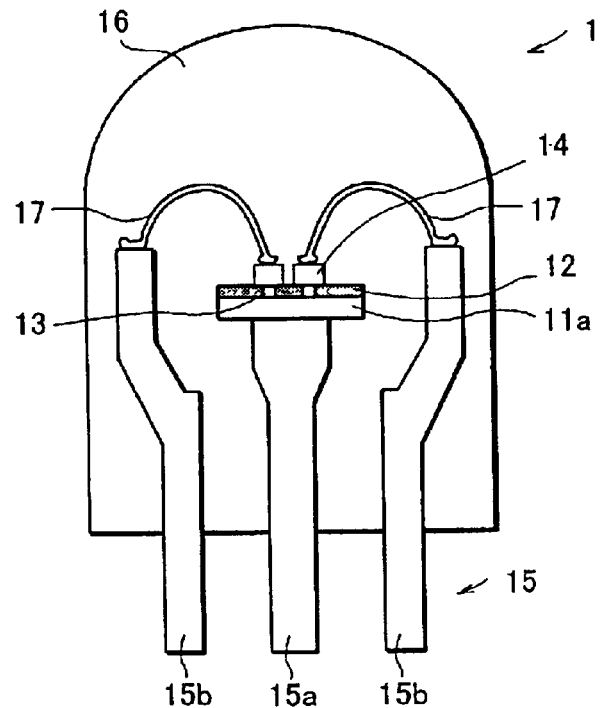
FIG. 5 is a schematic sectional construction view of an LED lamp according to an embodiment of the present invention.

Furthermore, it was also proved with the LED lamp shown in FIG. 5 that an entirely black-colored surface forming the light-reflecting surface of the light-reflecting cup 11 with LED chips 14 mounted therein could effectively reduce the reflection intensity of the externally inputted visible light 22 from the light-reflecting cup 11 without affecting the converging light emission from the LED chips 14.

FIG. 5 is a schematic sectional construction view of an LED lamp according to an embodiment of the present invention. While the conventional LED lamp of FIGS. 3A and 3B is provided with a light-reflecting cup 11 having an outwardly slanting sidewall surrounding the LED chips 14 mounted therein in the light path direction, the LED lamp of FIG. 5 is provided with a light-reflecting surface 11 with the LED chips mounted thereon, which has not a slant surface surrounding the LED chips 14 and has an element-mounted plain surface 11a of the size substantially equal to the total surface size of the LED chips 14.

As shown in FIG. 5, the LED lamp 1 according to the present invention is provided with two LED chips 14 that emit visible light, a lead frame 15 comprising a common part and two separate parts (hereinafter referred to as a common lead frame 15a and two separate lead frames 15b respectively), which are connected to electrode terminals (cathode or anode) of corresponding LED chips 14 for supplying electric power to the LED chips 14, and a transparent resin-made portion 16 for converging the light emitted from the LED chips 14.

The LED lamp 1 according to the present invention has an anti-reflection black-colored layer 12 as light-absorbing layer formed on an entire element-mounted surface 11a with the LED chips 14 mounted thereon.

Experiments with the LED lamp 1 thus constructed proved that a decrease in luminosity of light emitted from the LED chips 14 due to absorption of light by the black-colored anti-reflection layer 12 coated on entire element-mounted surface 11a with LED chips was sufficiently small (about 30%) and the reflection intensity of reflected light was considerably reduced in comparison with the conventional LED lamp 1 of FIG. 4 which was suffered to high intensity of visible light externally inputted therein and reflected from the light-reflection cup 11 with outwardly slanting wall surrounding the LED chips 14 mounted therein in the light path direction. Namely, the LED lamp according to the present invention is capable of considerably reducing the intensity of reflected visible light with no interference with the converging light emission from the LED chips 14.

However, when designing the LED lamp 1 having the anti-reflection black-colored layer 12 as light-absorbing layer as shown in FIG. 5, electrical connections between a common lead frame 15a and electrode terminals (cathode or anode) provided on the bottom of the LED chips 14 mounted on the common lead frame 15a must be ensured.

If the element-mounting surface 11a was covered with the anti-reflection black-colored layer 12 by usual dip coating or spray coating and openings 13 (through holes penetrating the anti-reflection black-colored layer 12) were made therein in positions corresponding to locations of the bottom electrode terminals (i.e., contact parts) of the LED chips 14 to be mounted thereon, this process may prevent converging the light emitted from the LED chips 14.

In other words, a process of molding resin protection for the LED chips 14 mounted on the dried anti-reflection black-colored layer 12 may cause the coating material of the anti-reflection black-colored layer 12 to be solved by the action of solvent used for resin molding and dispersed into the molding material, resulting in preventing the propagation of the light emitted from the LED chips 14.

To eliminate the above drawbacks, the present invention adopted such a LED lamp manufacturing process that the LED chips 14 are first mounted on the LED-chip mounting surface 11a of the common lead frame 15a (before forming the anti-reflection black-colored layer 12) and then the silver surfaces of the common lead frame 15a and the chip-mounted plate 11a are blackened to form the anti-reflection black-colored layer 12 for absorbing the reflection light.

Namely, the common lead frame 15a and the LED chip mounting surface 11a for mounting the LED chips 14 thereon are punched and then plated with subsequent layers of Fe, Ni, Ag or Fe, Cu, Ni, Ag and so on in the described order on their iron-based frames respectively. The surfaces of the common lead frame 15a and the LED chip mounting surface 11a for mounting the LED chips 14 thereon are finally plated with silver.

An electrode terminal (cathode or anode) disposed on the bottom of each of the LED chips 14 mounted on the LED chip mounting surface 11a is die-bonded with silver paste to the silver-plated common lead frame 15a to form the electric connection between them and the other electrode terminal (anode or cathode) provided on the top of each of the LED chips 14 is wire-bonded with silver paste to a silver-plated surface of one of two separate lead frames 15b (for emitting different light colors) to form the electric connection (lead wire) 17 between them. After that, the silver surface of the LED chips 11a mounting surface on the common lead frame 15a is exposed to UV (ultraviolet ray) in an atmosphere for one hour and then treated by hydrogen sulfide solution or gas of 60 degrees centigrade to form a black-colored layer of black silver sulfide.

The above-described process for forming a black silver sulfide layer may be carried out in an atmosphere of hydrogen sulfide gas instead of the hydrogen sulfide solution. According to the LED-lamp manufacturing method, the state equivalent to the state of FIG. 5 in which electric connections of the bottom contacts of the LED chips 14 through the openings 13 made in the anti-reflection black-colored layer 12 with the common lead frame 15a can be achieved in the stage when the anti-reflection black-colored layer 12 has been formed as a light-absorbing layer around the LED chips 14.

Experiments with an LED lamps 1 according to the present invention were carried out to estimate its performance in the same way as described for the conventional LED lamps according to the prior art.

According to the above-described LED lamp manufacturing process, we manufactured LED lamps 1, wherein electrode terminals disposed on the bottom surfaces of the LED chips 14 were electrically connected with individual die-bonds to the top of the common lead frame 15a, the other electrode terminals provided on the top surfaces of the LED chips 14 were electrically connected with individual wire-bonds to the top surfaces of corresponding separate lead frames 15b and then a black-colored silver-sulfide surface was formed on the element-mounting surface including the surface around each of the LED chips 14 mounted on the LED chip mounting surface 11a on the common lead frame 15a. Then, the LED lamps 1 were assembled to form a display panel 100.

The display panel 100 using the LED lamps 1 was examined in detail for the contrast between the light emitted from LED chips 14 of switched-on LED lamps 1 and the reflected sunlight from switched-off LED lamps 1 when the sunlight fell on the display panel at an elevation angle of 10 degrees.

The result of the experiment with the display panel comprising a specified number of LED lamps 1 each having a element-mounting surface (with LED chips mounted thereon) 11a with an anti-reflection (light-absorbing layer) black-colored (e.g., silver sulfide) layer 12 was such that the reflected light of the sunlight that entered the switched-off LED lamps 1 and was reflected from the LED chip mounting surface 11a and outputted from the lamps 1 could be reduced to about 30% of that of the conventional display panel using LED lamps not provided with a black-colored anti-reflection layer, wherein the intensity ratio of the reflected light from the switched-off LED lamps was about 70% of the total reflection intensity.

Furthermore, a decrease in luminosity of light emitted from LED chips 14 of the switched-on LED lamps 1 on the display panel due to light absorption by black-colored layers of the LED-chip-mounted surfaces 11a was limited to about 30%, achieving an increased contrast of the image on the display panel.

Instead of forming the black sulfide layer of the entire LED-chip-mounting surface 11a on the top of the common lead frame 15a mounting the LED chips 14 thereon, it is possible to electrically connect the electrode terminals disposed on the bottom of the LED chips 14 to the common lead frame 15a and fix the LED chips 14 onto the element-mounting surface 11a by using physically conducting and fixing paste such as for example black silver paste and black copper paste.

The black silver paste or black copper paste forms a black-colored conducting layer that is capable of electrically connecting the LED chips to the common lead frame 15a and serving as an anti-reflection black-colored layer 12 for absorbing visible light entered into the LED lamp and reached around the LED chips 14 without affecting the light emitted from the LED chips 14.

Figure 6:
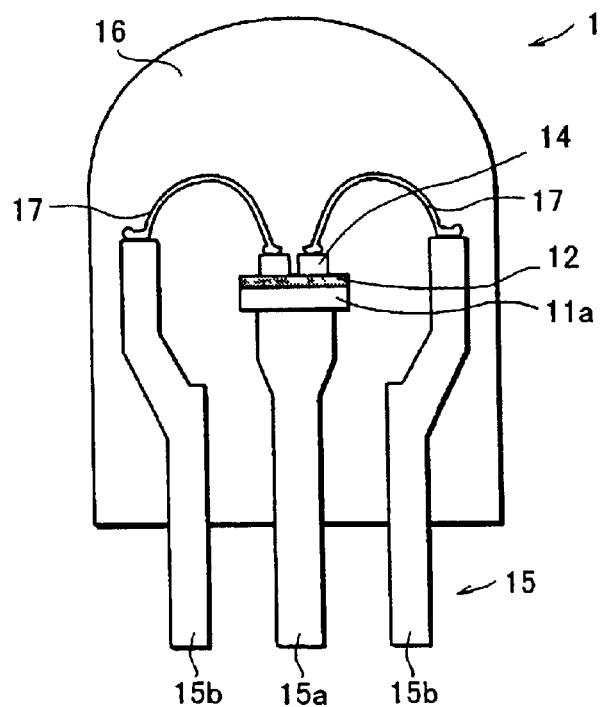
FIG. 6 is a schematic sectional construction view of an LED lamp according to another embodiment of the present invention.

FIG. 6 is a schematic sectional view of an LED lamp according to another embodiment of the present invention, which lamp has a LED-chip-mounting surface 11a with an anti-reflection black-colored layer 12 formed thereon by applying black silver paste or black copper paste. Since the black silver or copper paste layer has conductivity, there is no need for making openings 13 therein under the bottom surfaces of the LED chips 14.

Figure 7A:
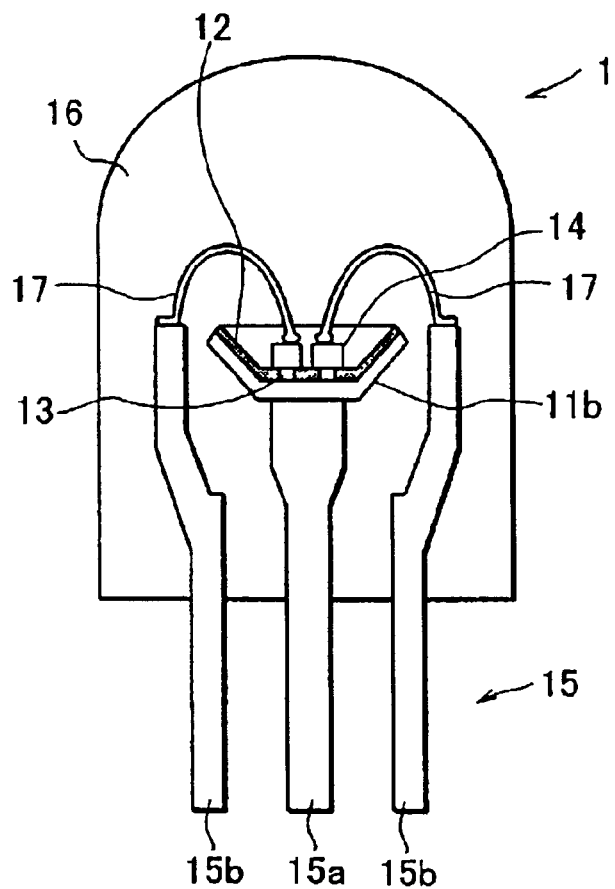
FIG. 7A is a schematic sectional construction view of an LED lamp according to another embodiment of the present invention and FIG. 7B is a schematic front view of an LED-chip-mounted-surface of the LED lamp of FIG. 7A.
Figure 7B:
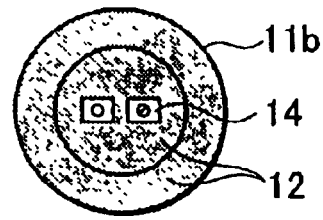

As described above, electrode terminals disposed on the bottom surfaces of the LED chips 14 are electrically connected with individual die-bonds to the top of the common lead frame 15a, the other electrode terminals provided on the top surfaces of the LED chips 14 are electrically connected with individual wire-bonds to the top surfaces of corresponding separate lead frames 15b and then a silver-plated surface of the LED-chip-mounted surface 11a on the top of the common lead frame 15a is exposed to ultraviolet rays for one hour and treated with hydrogen sulfide solution or gas of 60 degrees centigrade to form a black-colored silver-sulfide layer around the LED chips 14. As shown in FIGS. 7A and 7B, the LED-chip-mounted surface 11b formed in the shape of an open cup having an outwardly slanting side wall in the light path direction surrounding the LED chips 14 mounted therein and can achieve the same effect as the before described embodiments.

Namely, the display panel using the above-described LED lamps allows the incident sunlight to enter the LED lamps, wherein light passes the resin mold portion and strikes the upwardly slanting surface of the LED-chip-mounted cup 11a and is mostly absorbed by the wall layer without being reflected therefrom, thus reducing the intensity of the reflected sunlight.

Figure 8:
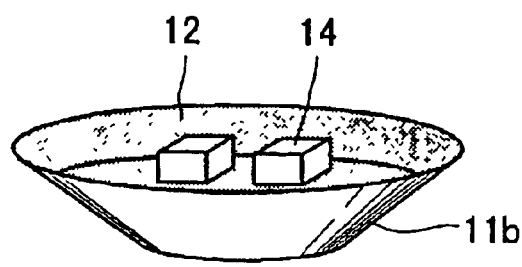
FIG. 8 is a perspective view of the LED-chip-mounted surface of the LED lamp shown in FIGS. 7A and 7B.

FIG. 7A is a schematic sectional view of the above-described LED lamp 1 embodying the present invention and FIG. 7B is a schematic front view of the LED-chip-mounted cup 11b of the LED embodiment of FIG. 7A. FIG. 8 is a perspective view of the LED-chip-mounted cup 11b shown in FIGS. 7A and 7B.

In FIGS. 7A, 7B and 8, there is shown an LED lamp wherein an LED chip mounting cup (i.e., an element-mounting cup) 11b mounted on a common lead frame 15a has a outwardly slanting wall in the light path direction surrounding LED chips 14 mounted therein and fully covered with an anti-reflection black-colored layer 12 serving as a light absorbing layer in which openings 13 are made for electrically connecting electrode terminals of the LED chips 14 to the common lead frame 15a on the bottom surfaces of the LED chips 14 in the same manner as in the embodiment shown in FIG. 5.

The anti-reflection black-colored layer 12 of the LED lamps of the present invention may be of, not limited to, black silver sulfide, black silver paste or black copper paste. For example, it is also possible to manufacture an LED lamp wherein electrode terminals disposed on the bottom surfaces of the LED chips 14 are electrically connected with individual die-bonds to the top of the common lead frame 15a, the other electrode terminals provided on the top surfaces of the LED chips 14 are electrically connected with individual wire-bonds to the top surfaces of corresponding separate lead frames 15b and then a silver-plated surface is oxidized by immersing it in nitric acid solution to form a black-colored silver-oxide layer for an anti-reflection black-colored layer 12 serving as a light absorbing layer around the LED chips 14 (i.e., on the LED-chip-mounted surface 11a or 11b). This LED lamp is equivalent to the LED with a black silver sulfide layer.

The process for oxidizing the silver-plated surface may be conducted by exposing it to ultraviolet rays in the oxygen gas atmosphere instead of immersing in the nitric acid solution.

Furthermore, the anti-reflection black-colored layer 12 serving a light absorbing layer may be formed by applying an iron oxide layer or a chromium oxide layer on the common lead frame 15a and the LED-chip-mounted surface 11a or 11b instead of the black silver oxide layer formed on the silver-plated common lead frame 15a and the LED-chip-mounted surface 11a or 12b.

The anti-reflection black-colored layer 12 serving as a light-absorbing layer for the LED-chip-mounting surface 11a (with no slanting surface) or 11b (with a slanting surface) for mounting LED chips 14 thereon is not be limited to the above-described example and may be formed mainly of black nickel or chromium or zinc. It is also possible to form a light-absorbing layer made mainly of black-colored resin.

Figure 9:
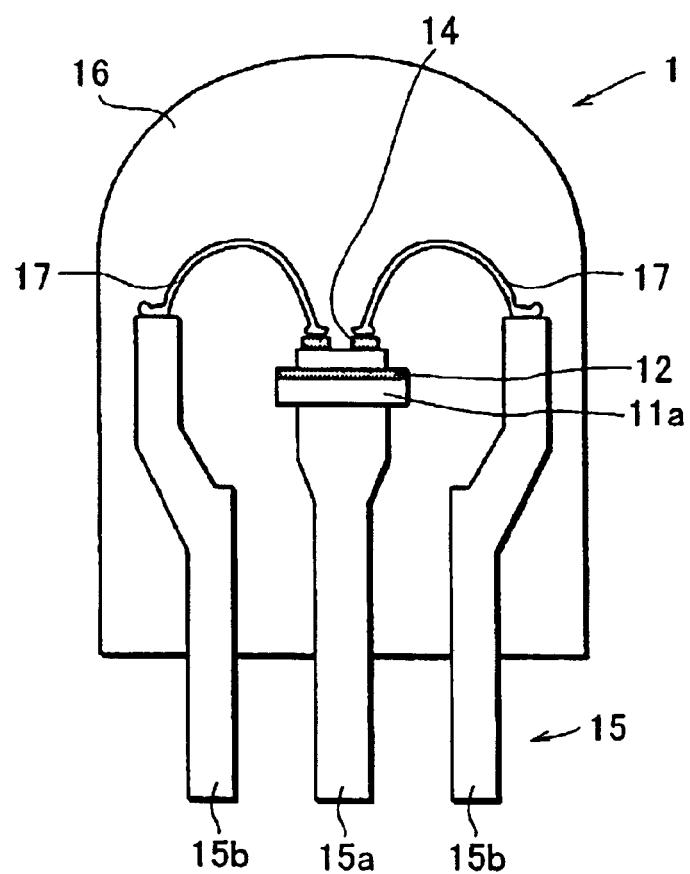
FIG. 9 is a schematic sectional construction view of an LED lamp according to another embodiment of the present invention.

FIG. 9 is a schematic sectional view showing another example of construction of an LED lamp according to the present invention. In the embodiment of FIG. 9, each of LED chips 14 has an electrode terminal on its top surface, which is connected with a lead wire 17 bonded to a separate lead frame 15b. The LED chips 14 are directly bonded in place to the top surface of a common lead frame 15a with no need for making openings 13 in an anti-reflection black-colored layer formed thereon.

Active layers of LED chips 14 in an LED lamp according to the present invention may be of material having high color developing property regarding multicolor emission such as for example AlGaAS, GaAS, GaInP, GaP and InP. The active layers may also be of material composed of four-element, that is, AlGaInP.

According to the LED lamp and the manufacturing method of the LED lamp proposed by the present invention, it is possible to easily produce an LED lamp having a black-colored element-mounted surface (i.e., a black surface with chips mounted thereon), which can effectively prevent the reflection intensity of visible incident light.

An outdoor display panel with affection of sunlight using the LED lamps according to the present invention is capable of displaying an image with a highly improved contrast between the light emitted from the LED chips of the switched-on LED lamps and the reflected sunlight from the switched-off LED lamps under any working conditions on the site where the visible light of the sunlight reaches the LED lamps and for any time period in which the incident angle of the sunlight to the display panel changes.

What is claimed is:

1. A method of forming a light absorbing layer on an LED-chip-mounted surface of an LED, wherein the LED comprises an LED chip, a lead frame comprising a silver-plated common part and separate parts for supplying electric power to each electrode terminal of the LED chip, and a transparent resin part disposed on the lead frame for mounting the LED chip and converting light emitted from the LED chip, said method comprising:

sulfurizing the silver-plated surface with hydrogen sulfide solution or hydrogen sulfide gas after connecting the electrode terminals of the LED chip to said silver-plated common part by die-bonding using silver paste and said separate parts by wire-bonding.

2. A method of forming a light absorbing layer on an LED-chip-mounted surface of an LED, wherein the LED comprises an LED chip, a lead frame comprising a silver-plated common part and separate parts for supplying electric power to each electrode terminal of the LED chip, and a transparent resin part disposed on the lead frame for mounting the LED chip and converting light emitted from the LED chip, said method comprising:

oxidizing the silver-plated surface by immersing into nitric acid solution or exposing to ultraviolet rays in oxygen gas atmosphere after connecting the electrode terminals of the LED chip to said silver-plated common part by die-bonding using silver paste and said separate parts by wire-bonding.

* * * * *